(12) United States Patent
Nordlöf et al.

(10) Patent No.: US 7,727,621 B2
(45) Date of Patent: Jun. 1, 2010

(54) INSERT FOR MILLING OF STEEL

(75) Inventors: Kjell Nordlöf, Bromma (SE); Maria Åstrand, Sollentuna (SE); Toril Myrtveit, Kungsängen (SE); Anders Lundquist, Haninge (SE); Mats Ahlgren, Täby (SE)

(73) Assignee: Sandvik Intellectual Property AB, Sandviken (SE)

( * ) Notice: Subject to any disclaimer, the term of this patent is extended or adjusted under 35 U.S.C. 154(b) by 633 days.

(21) Appl. No.: 11/633,643

(22) Filed: Dec. 5, 2006

(65) Prior Publication Data

US 2007/0141346 A1 Jun. 21, 2007

(30) Foreign Application Priority Data

Dec. 8, 2005 (SE) .................................. 0502694

(51) Int. Cl.
*B32B 9/00* (2006.01)

(52) U.S. Cl. ............................ 428/216; 51/307; 51/309; 204/192.38; 407/119; 428/336; 428/472; 428/697; 428/698; 428/699

(58) Field of Classification Search ................... 51/307, 51/309; 428/216, 336, 472, 697, 698, 699, 428/701, 702; 407/119; 204/192.38
See application file for complete search history.

(56) References Cited

U.S. PATENT DOCUMENTS

| 6,103,357 | A | 8/2000 | Selinder et al. |
| 6,177,178 | B1 | 1/2001 | Östland et al. |
| 6,250,855 | B1 * | 6/2001 | Persson et al. ............... 428/216 |
| 6,309,738 | B1 | 10/2001 | Sakurai |

(Continued)

FOREIGN PATENT DOCUMENTS

EP 1 038 989 9/2000

(Continued)

OTHER PUBLICATIONS

Andersen et al., "Deposition, microstructure and mechanical and tribological properties of magnetron sputtered TiN/TiAlN multilayers", Surface and Coatings Technology, vol. 123 (2000) pp. 219-226.

(Continued)

*Primary Examiner*—Archene Turner
(74) *Attorney, Agent, or Firm*—Drinker Biddle & Reath LLP

(57) ABSTRACT

The present invention relates to a cutting tool, e.g. carbide insert, solid carbide drill or mill or carbide tip, particularly for milling of steels, stainless steel, HRSA, titanium or any alloyed material from any of these groups, comprising a cemented carbide substrate and an aperiodic multilayer coating with:

a substrate of cemented carbide having a composition of from about 8 to about 11 wt-% Co, from about 0.1 to about 0.5 wt-% Cr and balance essentially tungsten carbide and a coating which is essentially an aperiodic multilayer consisting of layers A+B+A+B+A ... where the sublayers A and B consist of $Al_xTi_{1-x}N$ and $Ti_yAl_{1-y}N$ respectively. The typical average thickness of each A+B sequence is in the range from about 30 to about 300 nm and the total thickness of the coating in the range from about 0.5 to about 20 μm. The total chemical composition averaged over the whole coating consists of $Ti_zAl_{1-z}N$ where z lies in the range from about 0.40 to about 0.70.

17 Claims, 1 Drawing Sheet

U.S. PATENT DOCUMENTS

| | | |
|---|---|---|
| 6,326,093 B1 | 12/2001 | Lindhold et al. |
| 6,406,224 B1 * | 6/2002 | Ostlund et al. .............. 407/119 |
| 2004/0026236 A1 | 2/2004 | Penich et al. |

FOREIGN PATENT DOCUMENTS

| | | | |
|---|---|---|---|
| JP | 98/48072 | | 10/1998 |
| JP | 2003-245806 | * | 9/2003 |
| WO | 98/48072 | | 10/1998 |
| WO | 01/16389 | | 3/2001 |
| WO | 01/18272 | | 3/2001 |

OTHER PUBLICATIONS

Hsieh et al., "Deposition and characterization of TiAln and multi-layered TiN/TiAlN coatings using unbalanced magnetron sputtering", Surface and Coatings Technology, vol. 108-109 (1998) pp. 132-137.

* cited by examiner ized cracks in the coatings. This is especially a concern with cooled/wet operations where the thermal variations are more pronounced than in dry operations.
INSERT FOR MILLING OF STEEL

BACKGROUND OF THE INVENTION

The present invention pertains to a coated cemented carbide insert for machining of steels or stainless steel when a high wear resistance combined with a high edge toughness are required.

In typical milling operations, the thermal load on the insert will vary over time, something that often induces thermal tension and subsequently may generate thermally induced cracks in the coatings. This is especially a concern with cooled/wet operations where the thermal variations are more pronounced than in dry operations.

A common wear mechanism in milling is cracking, followed by chipping or small fragments of the cutting edge loosening from the rest of the substrate. Increasing the edge toughness is thus of great importance to increase tool lifetime. One possible solution to decrease the risk of thermal cracking—as well as cracking for various other reasons—is to use a multilayered coating. The multilayered coating is expected to act as a crack inhibitor as an initial crack going down the coating may be redirected at any sublayer interface. Another benefit of multilayer coatings is expected to show up when hard, wear resistant layers are interlaid with a softer sublayer. The softer layer may be able to absorb shocks and thus inhibit cracks from penetrating the whole coating.

WO 98/48072 relates to a cutting tool comprising a body of sintered cemented carbide, ceramic or high speed steel on which at least on the functional parts of the surface of the body, a thin, adherent, hard and wear resistant coating is applied. The coating comprises a laminar, multilayered structure of refractory compounds in polycrystalline, non-repetitive form MX+NX+MX+NX . . . where the alternating layers MX and NX are composed of metal nitrides or metal carbides. The sequence of individual layer thicknesses is essentially aperiodic throughout the entire multilayered structure.

OBJECTS AND SUMMARY OF THE INVENTION

It is an object of the present invention to provide a cutting tool insert able to withstand the wear mechanisms typical for intermittent operations, like e.g. milling of steels.

In one aspect of the invention, there is provided a cutting insert comprising a cemented carbide substrate and a coating wherein the substrate comprises WC, from about 8 to about 11 wt-% Co, and from about 0.1 to about 0.5 wt-% Cr, with coercivity in the range from about 18 to about 22 kA/m, and with a CW-ratio within from about 0.78 to about 0.90, and the coating comprises a laminar, multilayered structure of A+B+A+B . . . where layers A and B are respectively, $Al_xTi_{1-x}N$ and $Ti_yAl_{1-y}N$ in polycrystalline, non-repetitive form, with x=from about 0.4 to about 0.7, y=from about 0.6 to about 1, and x<y, with an average thickness of one A+B-sublayer within the range from about 30 to about 300 nm, varying essentially at random and with a total thickness of the multilayered coating of from about 0.5 µm to about 15 µm on the rake side and from about 2 to about 8 µm on the flank side.

In another aspect of the invention, there is provided a method of making a cutting insert comprising a cemented carbide substrate and a coating comprising providing a substrate of WC, from about 8 to about 11 wt-% Co and from about 0.1 to about 0.5 wt-% Cr, with coercivity in the range from about 18 to about 22 kA/m and a CW-ratio of from about 0.78 to about 0.90, and depositing a coating comprising a laminar, multilayered structure of A+B+A+B . . . where layers A and B are of, respectively, $Al_xTi_{1-x}N$ and $Ti_yAl_{1-y}N$ in polycrystalline, non-repetitive form, with x=from about 0.4 to about 0.7, and y=from about 0.6 to about 1, with an average thickness of one A+B-sublayer within the range from about 30 to about 300 nm, varying essentially at random and with a total thickness of the multilayered coating of from about 0.5 µm to about 15 µm on the rake side and from about 2 to about 8 µm of the flank side using cathodic arc evaporation using two or three pairs of arc sources of pure Ti and/or TiAl alloy(s), in an $N_2$ or a mixed $N_2$+Ar gas atmosphere.

In a still further aspect of the invention, there is provided the use of a cutting insert as described above in the milling of steel alloys and stainless steels with cutting speeds and feed rates according to the following—milling with 90° entering angle at Vc=from about 25 to about 350 m/min, and fz: from about 0.04 to about 0.4 mm/tooth; or—face milling at 45°-75° entering angle at Vc: from about 25 to about 350 m/min and fz: from about 0.05 to about 0.7 mm/tooth; or—high feed milling applications at Vc: from about 25 to about 350 m/min and fz: from about 0.30 to about 3.0 mm/tooth.

DETAILED DESCRIPTION OF THE PREFERRED EMBODIMENTS

Figure 1:
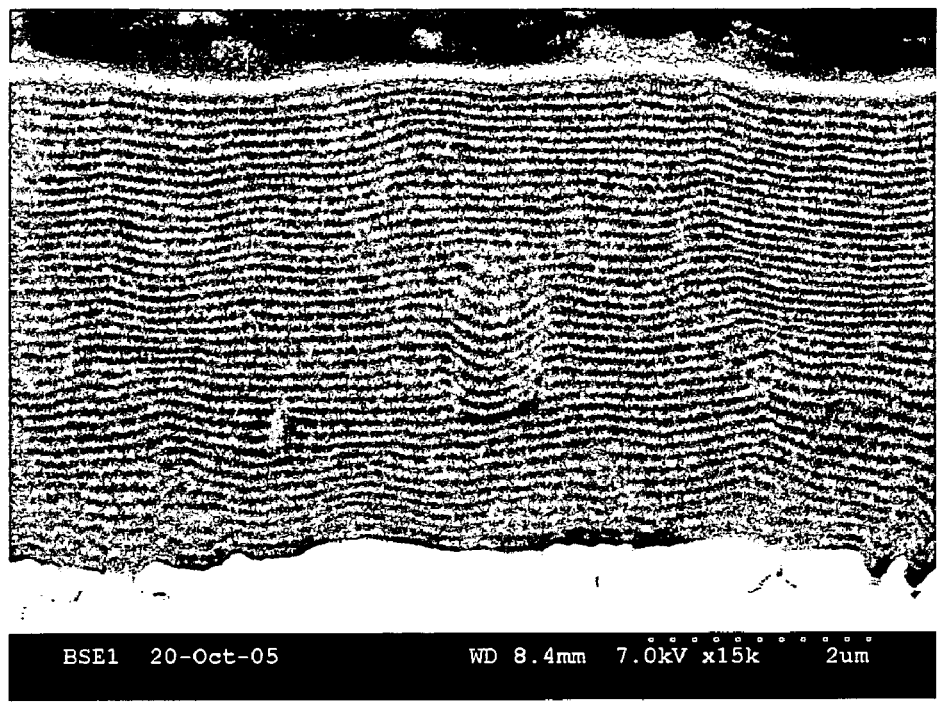
FIG. 1 shows a scanning electron microscopy (SEM) picture of the coating with all the individual multilayers.

It has been found that thin multilayers, where a wear resistant layer consisting of a (Ti,Al)N with a high Al content is interlaced with softer thin (Ti,Al)N layer with high Ti content, gives a coating more resistant to cracking in intermittent operation.

According to the present invention, a coated cutting tool insert is provided of a cemented carbide body with a composition of from about 8 to about 11 wt-% Co, preferably from about 9.5 to about 10.5 wt-% Co, most preferably from about 9.9 to about 10.1 wt-% Co, from about 0.1 to about 0.5 wt-% Cr, preferably from about 0.38 to about 0.40 wt-% Cr, and balance WC. The cemented carbide body may also contain smaller amounts of other elements on a level corresponding to a technical impurity. The coercivity is in the range from about 18 to about 22 kA/m, preferably from about 19 to about 21 kA/m, most preferably from about 19.8 to about 20.2 kA/m. The cobalt binder phase is alloyed with a certain amount of W and Cr giving the presented cemented carbide cutting insert its desired properties. W and Cr in the binder phase influence the magnetic properties of cobalt and can hence be related to a value CW-ratio, defined as CW-ratio=magnetic-% Co/wt-% Co where magnetic-% Co is the measured weight percentage of magnetic material in the body and wt-% Co is the weight percentage of Co in the body.

The CW-ratio varies between from about 1 and about 0.75 dependent on the degree of alloying of the binder phase. A lower CW-ratio correspond to higher W and Cr contents and a CW-ratio=1 corresponds practically to an absence of W and Cr in the binder phase.

It has now been found according to the present invention that improved cutting performance is achieved if the cemented carbide body has a CW-ratio in the range of from about 0.78 to about 0.90, preferably within the range of from about 0.80 to about 0.89, and most preferably within from about 0.83 to about 0.87. The cemented carbide may also contain small amounts, less than about 1 volume %, of η-phase ($M_6C$), without any detrimental effects. From the specified CW-ratios (less than about 1) it also follows that no free graphite is allowed in the cemented carbide body according to the present invention.

The insert according to the present invention is provided with an aperiodic TiAlN multilayer consisting of a binary A+B+A+B+ . . . structure with thin alternating sublayers A and B being repeated throughout the entire coating. One sequence of a sublayer A+B is here denoted a lamella. Due to the aperiodic nature of the coating, the thickness of each lamella will vary but in average the lamella thickness is from about 30 to about 300 nm, preferably from about 60 to about 120 nm. The sublayer A comprises $Al_xTi_{1-x}N$, where x is from about 0.40 to about 0.7, preferably from about 0.5 to about 0.67. Layer B comprises of $Ti_yAl_{1-y}N$, where y is from about 0.6 to about 1, preferably from about 0.75 to about 1. The stoichiometry for the whole coating as measured by e.g., microprobe or EDS, is within the interval $Ti_zAl_{1-z}N$, z: from about 0.40 to about 0.7, preferably from about 0.45 to about 0.6. The total thickness of the multilayered coating is from about 0.5 μm to about 15 μm, preferably from about 1 μm to about 10 μm, more preferably from about 1 to about 5 μm on the rake side and from about 2 to about 8 μm on the flank side. In a preferred embodiment, there is an outer $Ti_bAl_{1-b}N$ layer, b=from about 0.8 to about 0.9, preferably from about 0.82 to about 0.85, has sufficient thickness to give a visible, homogenous bronze-colored look, preferably from about 0.1 to about 1 μm thick.

The present invention also relates to a method of making a cutting insert comprising a cemented carbide substrate and a coating. According to the method, a substrate of WC, from about 8 to about 11 wt-% Co, preferably from about 9.9 to about 10.1 wt-% Co, most preferably from about 9.5 to about 10.5 wt-% Co and from about 0.1 to about 0.5 wt-% Cr with a coercivity in the range from about 18 to about 22 kA/m, preferably from about 19 to about 21 kA/m, most preferably 19.8-20.2 kA/m, and a CW-ratio in the range of from about 0.78 to about 0.90, preferably within from about 0.80 to about 0.89, and most preferably within from about 0.83 to about 0.87. Onto this substrate is deposited a coating comprising a laminar, multilayered structure of A+B+A+B . . . where layers A and B consists of, respectively, $Al_xTi_{1-x}N$ and $Ti_yAl_{1-y}N$ in polycrystalline, non-repetitive form, with x=0.40-0.70, preferably from about 0.50 to about 0.67, and y=from about 0.60 to about 1.00, preferably from about 0.75 to about 1.00, with an average thickness of one A+B-sublayer within the range from about 30 to about 300 nm, preferably from about 60 to about 120 nm, varying essentially at random. The total thickness of the multilayered coating is from about 0.5 μm to about 15 μm, preferably from about 1 μm to about 10 μm, more preferably from about 1 to about 5 μm on the rake side and from about 2 to about 8 μm on the flank side. The coating is deposited using cathodic arc evaporation using two or three pairs of arc sources consisting of pure Ti and/or TiAl alloy(s), in an $N_2$ or mixed $N_2$+Ar gas atmosphere. In a preferred embodiment, an outer $Ti_bAl_{1-b}N$ layer, b=from about 0.8 to about 0.9, preferably from about 0.82 to about 0.85, of sufficient thickness to give a visible, homogenous bronze-colored look, preferably from about 0.1 to about 1 μm thick is deposited.

The present invention also relates to the use of a cutting tool insert according to the above in milling steel alloys and stainless steels, preferably under dry conditions, with cutting speeds and feed rates according to following table:

Milling with 90 degrees entering angle:
   Vc: from about 25 to about 350 m/min, preferably from about 50 to about 250 m/min and fz: from about 0.04 to about 0.4 mm/tooth
Face milling (45-75 degrees entering angle):
   Vc: from about 25 to about 350 preferably from about 50 to about 250 m/min and fz: from about 0.05 to about 0.7 mm/tooth
High feed milling concepts:
   Vc: from about 25 to about 350 m/min and fz: from about 0.30 to about 3.0 mm/tooth, preferably from about 0.3 to about 1.8 mm/tooth.

The invention is additionally illustrated in connection with the following examples, which are to be considered as illustrative of the present invention. It should be understood, however, that the invention is not limited to the specific details of the examples.

Example 1

Aperiodic multilayers were deposited by cathodic arc evaporation on cemented carbide milling inserts with a composition of 10 wt-% Co, 0.4 wt-% Cr and balance WC, and with a coercivity value of 20.2 kA/m and an CW-ratio of 0.85 as measured in the FÖRSTER KOERZIMAT CS 1.096 from Foerster Instruments Inc. The multilayers were deposited from one pair of $Ti_{84}Al_{16}$ targets and two pairs of $Ti_{33}Al_{67}$ targets with the inserts mounted on a 3-fold rotating substrate table arranged in order to obtain the aperiodic structure. The arc evaporation was performed in a $N_2$ atmosphere. The total coating thickness was in the range 2-9 μm, varying from batch to batch, from insert to insert, and over the insert surface. The coating consisted of a binary A+B+A+B+A+B aperiodic multilayer, i.e. layers with a non-repetitive thickness, but with an average A+B layer thickness of 60-120 nm. The insert was coated with a final outer layer of $Ti_{84}Al_{16}N$ to produce a bronze color.

Figure 2:
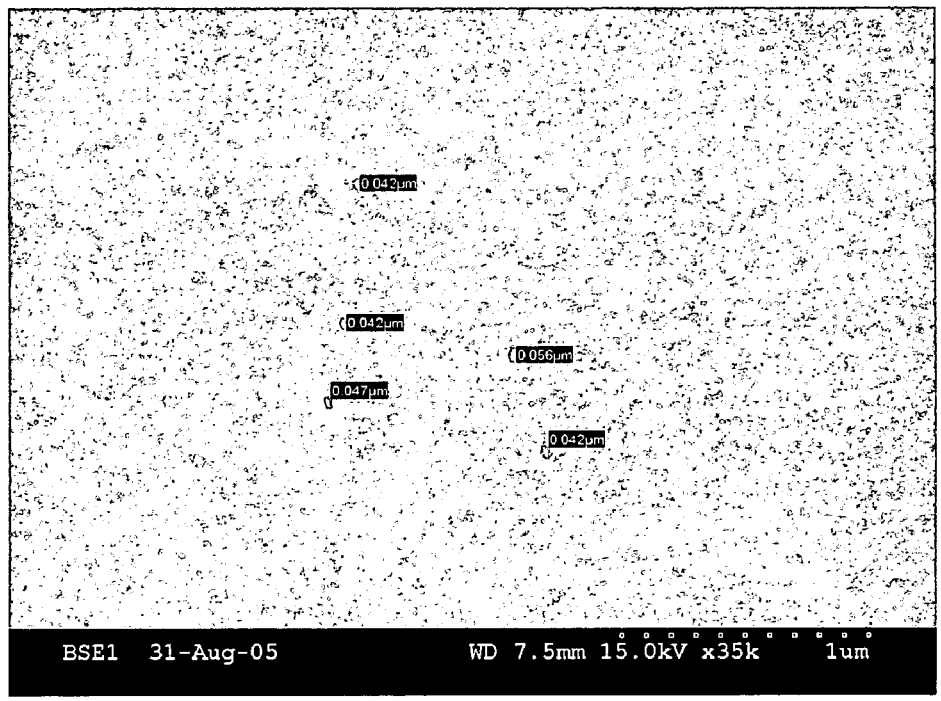
FIG. 2 shows a SEM picture of a detail of the coating where the individual layers are measured, and where the essentially aperiodic nature of the layer structure is evident.

SEM pictures of this coating in cross section are seen in FIGS. 1 and 2. The aperiodic nature can be seen from FIG. 2. The waviness in the sublayers originates at least partly from the substrate roughness.

The coating had an average composition $Ti_zAl_{1-z}N$ lying between the composition of the two sublayers A and B. This average composition was measured in a micro-probe at the center of the flank side. A composition corresponding to $Ti_{0.5}Al_{0.5}N$ was obtained.

Explanations to Examples 2-7

The following expressions/terms are commonly used in metal cutting, and explained in the table below:
   Vc (m/min): cutting speed in meters per minute
   fz (mm/tooth): feed rate in millimeter per tooth
   z: (number) number of teeth in the cutter
   $a_e$ (mm): radial depth of cut in millimeter
   $a_p$ (mm): axial depth of cut in millimeter
   D (mm): cutter diameter in millimeter

Example 2

Inserts from Example 1 were tested and compared to Reference A which is a homogenous $Ti_{33}Al_{67}N$ layer of the same thickness comprising the same substrate. Both inserts were of geometry R390-11T0308M-PM. They were tested in a low alloy steel with $V_c$=150 m/min, $f_z$=0.15 mm/tooth, $a_e$=25 mm, $a_p$=3 mm, z=3, D=25 mm. Coolant: emulsion. The insert from example 1 lasted 56 minutes in this application, whereas Reference A lasted only 29 minutes. The decisive difference in wear type for increasing the tool life was less chipping in the edge line.

Example 3

Inserts from Example 1 were tested and compared to Reference A (homogenous $Ti_{33}Al_{67}N$ layer) as well as Reference B (TiN multilayer interlayered with TiCN and a thicker TiCN layer on top). The geometry were in all cases N331A-145008 H-WL. The work material was unalloyed steel. Dry conditions. Cutting conditions were Vc=466 m/min, fz=0.22 mm/tooth. Reference B lasted 2.3 minutes, Reference A lasted 9 minutes. After 9 minutes the multilayer insert from example 1 was still in use with only small signs of wear whereas the other two inserts had to be taken out of use because of severe damages. The decisive difference in wear type for increasing the tool life was less chipping in the edge line.

Example 4

Inserts with a geometry R300-1648M-PH and with the same substrate composition and the same coating as those in Example 1 were tested and compared to Reference A with a homogenous $Ti_{33}Al_{67}N$ layer of the same thickness deposited on inserts from the same substrate batch. The work material in this case was a tool steel with a hardness of 48 HRC. The cutting data were: $V_c$=35 m/min, fz=0.5 mm/tooth, z=6, $a_p$=1.5 mm, D=63 mm, $a_e$=30-64 mm. Coolant: air blow. In this test tool life was 17 minutes compared to only 12 minutes for Reference A, an increase of 42%. The decisive difference in wear type for increasing the tool life was better notch wear resistance.

Example 5

Inserts from Example 1 were tested and compared to a Reference A as well as Reference B. The geometry was in all cases R390-11T0308M-PM. The work material was an alloyed steel with a hardness of 220 HB. Cutting conditions were Vc=94 m/min, fz=0.055 mm/tooth. Dry conditions. Reference B could machine 16 components, Reference A 24 components and the inserts from Example 1 could machine 40 components. The decisive difference in wear type for increasing the tool life was less chipping in edge line.

Example 6

Inserts from Example 1 were tested and compared to a Reference A as well as Reference B. The geometry were in all cases CM245-12T3 E-PL. The work material was an austenitic stainless steel. Cutting data: Vc=250 m/min fz=0.09 mm/tooth, $a_p$=2 mm $a_e$=50 mm z=1. Dry conditions. In this test the inserts from Example 1 lasted 6 meters, Reference A lasted 3.5 meters and Reference B lasted 3 meters. The multilayer inserts from Example 1 clearly outperforms the other variants. The decisive difference in wear type for increasing the tool life was better edge line toughness (no cracks, no edge breakdown).

Example 7

Inserts from Example 1 were tested and compared to a Reference C according to Example 1 in patent application WO 01/16389. The geometry was R210-140512M-PM in all cases. The work material was a tool steel with a hardness of 45 HRC. Cutting data: Vc=90 m/min fz=0.58 mm/tooth, $a_p$=1 mm, $a_e$=38.6 mm, z=1, D=66 mm. Dry conditions. In this test the inserts from Example 1 lasted 34 minutes whereas Reference C as best result achieved 14 minutes. Decisive difference in wear type for increasing the tool life was better notch wear resistance.

In conclusion the insert according to the invention is able to withstand all wear types better than other tested inserts, showing a more predictable edge line behavior and being more reliable in unstable conditions. It allows an increase in cutting data.

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

The invention claimed is:

1. Cutting insert comprising a cemented carbide substrate and a multilayer coating wherein
    the substrate comprises WC, from about 8 to about 11 wt-% Co, and from about 0.1 to about 0.5 wt-% Cr, with coercivity in the range from about 18 to about 22 kA/m, and with a CW-ratio within from about 0.78 to about 0.90, and
    the multilayer coating comprises a laminar, aperiodic multilayered structure of A+B+A+B . . . where layers A and B are respectively, $Al_xTi_{1-x}N$ and $Ti_yAl_{1-y}N$ in polycrystalline, non-repetitive form, with x=from about 0.4 to about 0.7, y=from about 0.6 to about 1, and x<y, with an average thickness of one A+B-sublayer within the range from about 30 to about 300 nm, varying essentially at random and with a total thickness of the multilayered coating of from about 0.5 μm to about 15 μm on the rake side and from about 2 to about 8 μm on the flank side.

2. The cutting insert of claim 1 wherein the substrate comprises from about 9.5 to about 10.5 wt-% of Co, from about 0.38 to about 0.40 wt-% Cr, the coercivity of the substrate being from about 19 to about 21 kA/m and with a CW-ratio of from about 0.80 to about 0.89.

3. The cutting insert of claim 2 wherein the substrate comprises from about 9.9 to about 10.1 wt-% Co with the coercivity of the substrate being from about 19.8 to about 20.2 kA/m and with a CW-ratio of from about 0.83 to about 0.87.

4. The cutting insert of claim 1 wherein in said multilayered structure, x is from about 0.5 to about 0.67, y is from about 0.75 to about 1, the average thickness of one A+B layer is within the range of from about 60 to about 120 nm and the total thickness of the multilayered coating is from about 1 to about 5 μm on the rake side.

5. The cutting tool of claim 1 further comprising an outer $Ti_bAl_{1-b}N$ layer, b=from about 0.8 to about 0.9 of sufficient thickness to give a visible, homogenous bronze-colored look.

6. The cutting insert of claim 5 wherein b is from about 0.82 to about 0.85 and the outer $Ti_bAl_{1-b}N$ layer has a thickness of from about 0.1 to about 1 μm.

7. The cutting insert of claim 1 wherein the total chemical composition averaged over the whole multilayer coating is z=from about 0.4 to about 0.7 expressed as $Ti_zAl_{1-z}N$.

8. The cutting insert of claim 7 wherein z=from about 0.45 to about 0.6.

9. Method of making a cutting insert comprising a cemented carbide substrate and a multilayer coating comprising providing a substrate of WC, from about 8 to about 11 wt-% Co and from about 0.1 to about 0.5 wt-% Cr, with coercivity in the range from about 18 to about 22 kA/m and a CW-ratio of from about 0.78 to about 0.90, and depositing a coating comprising a laminar, a periodic multilayered structure of A+B+A+B . . . where layers A and B are of, respectively, $Al_xTi_{1-x}N$ and $Ti_yAl_{1-y}N$ in polycrystalline, non-repetitive form, with x=from about 0.4 to about 0.7, and y=from about 0.6 to about 1, with an average thickness of one A+B-sublayer within the range from about 30 to about 300 nm, varying essentially at random and with a total thickness of the multilayered coating of from about 0.5 μm to about 15 μm, on the rake side and from about 2 to about 8 μm of the flank side using cathodic arc evaporation using two or three pairs of arc sources of pure Ti and/or TiAl alloy(s), in an $N_2$ or a mixed $N_2$+Ar gas atmosphere.

10. The method of claim 9 wherein the substrate comprises from about 9.5 to about 10.5 wt-% Co.

11. The method of claim 9 wherein in the layers A+B, x is from about 0.5 to about 0.67, y is from about 0.75 to about 1, the average thickness of one A+B layer is from about 60 to about 120 nm and the total thickness of the multilayered coating is from about 1 to about 10 μm on the rake side.

12. The method of claim 11 wherein the thickness of the multilayered coating is from about 1 to about 5 μm.

13. The method of claim 12 further comprising an outer $Ti_bAl_{1-b}N$ layer, b=0.8-0.9, of sufficient thickness to give a visible, homogenous bronze-colored look.

14. The method of claim 13 wherein b is from about 0.82 to about 0.85 and the outer $Ti_zAl_{1-b}N$ layer has a thickness of from about 0.1 to about 1 μm.

15. Use of a cutting insert of claim 1 in the milling of steel alloys and stainless steels, with cutting speeds and feed rates according to the following:
   milling with 90° entering angle at Vc=from about 25 to about 350 m/min, and fz: from about 0.04 to about 0.4 mm/tooth; or
   face milling at 45°-75° entering angle at Vc: from about 25 to about 350 m/min, and fz: from about 0.05 to about 0.7 mm/tooth; or
   high feed milling applications at Vc: from about 25 to about 350 m/min and fz: from about 0.30 to about-3.0 mm/tooth.

16. In the use of claim 15 wherein milling is performed at a Vc of from about 50 to about 250 m/min.

17. In the use of claim 15 wherein the face milling is performed at a Vc of from about 50 to about 250 m/min.

* * * * *